United States Patent
Byun et al.

(10) Patent No.: US 9,203,051 B2
(45) Date of Patent: Dec. 1, 2015

(54) ORGANIC LIGHT EMITTING DISPLAY APPARATUS INCLUDING VISCOELASTIC LAYER AND METHOD FOR MANUFACTURING THE SAME

(71) Applicant: LG Display Co., Ltd., Seoul (KR)

(72) Inventors: Hyun Tae Byun, Incheon (KR); Eun Ah Song, Paju-si (KR); Hee Chul Lim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/535,471

(22) Filed: Nov. 7, 2014

(65) Prior Publication Data

US 2015/0144909 A1    May 28, 2015

(30) Foreign Application Priority Data

Nov. 27, 2013    (KR) .................. 10-2013-0145331

(51) Int. Cl.
| | | |
|---|---|---|
| *H01L 51/00* | (2006.01) | |
| *H01L 51/52* | (2006.01) | |
| *H01L 27/32* | (2006.01) | |

(52) U.S. Cl.
CPC ........... *H01L 51/5253* (2013.01); *H01L 27/323* (2013.01); *H01L 51/5256* (2013.01); *H01L 51/5262* (2013.01); *H01L 51/5281* (2013.01); *H01L 2251/5338* (2013.01)

(58) Field of Classification Search
CPC . H01L 51/50; H01L 51/56; H01L 2251/5338; H01L 51/5253; H01L 27/323; H01L 51/5256; H01L 51/5262; H01L 51/5281

USPC .............. 257/40, 79, 100, E39.007; 438/28
See application file for complete search history.

(56) References Cited

U.S. PATENT DOCUMENTS

| | | | | |
|---|---|---|---|---|
| 5,296,974 | A * | 3/1994 | Tada | ................. G02F 1/172 |
| | | | | 359/228 |
| 2004/0041147 | A1* | 3/2004 | Park | .............. H01L 51/5256 |
| | | | | 257/40 |
| 2011/0057208 | A1* | 3/2011 | Jeon | ............... H01L 51/5246 |
| | | | | 257/88 |
| 2013/0100529 | A1 | 4/2013 | Kitagawa et al. | |
| 2014/0308494 | A1 | 10/2014 | Iwaya et al. | |

FOREIGN PATENT DOCUMENTS

| | | | |
|---|---|---|---|
| JP | 2003-086352 A | 3/2003 | |
| JP | 2004-095551 A | 3/2004 | |
| JP | 2007-200692 A | 8/2007 | |
| JP | 2010-003635 A | 1/2010 | |

(Continued)

*Primary Examiner* — Duy T Nguyen
(74) *Attorney, Agent, or Firm* — Dentons US LLP

(57) ABSTRACT

Disclosed is an organic light emitting display (OLED) apparatus that includes a substrate; an organic light emitting element on the substrate, the organic light emitting element including a first electrode, an organic light emitting layer and a second electrode; a viscoelastic layer on the organic light emitting element, wherein an elastic portion of the viscoelastic layer is about 30% or more, the elastic portion being defined by <Equation 1>: Elastic portion $(E_p)$ (%)=$(\sigma/\sigma_0) \times 100$, wherein $\sigma_0$ is an initial stress generated when a strain of about 50% is applied to the viscoelastic layer and $\sigma$ is a final stress measured after the strain is continuously applied thereto for about 180 seconds, with the initial stress $\sigma_0$ and the final stress $\sigma$ being measured at about 80° C. through a relaxation modulus test.

10 Claims, 10 Drawing Sheets

(56) References Cited

FOREIGN PATENT DOCUMENTS

| JP | 2010-133987 A | 6/2010 |
| JP | 2012-133312 A | 7/2012 |
| JP | 2013-077460 A | 4/2013 |
| KR | 10-2009-0128301 A | 12/2009 |
| WO | 2013-065812 A1 | 5/2013 |

\* cited by examiner

ORGANIC LIGHT EMITTING DISPLAY APPARATUS INCLUDING VISCOELASTIC LAYER AND METHOD FOR MANUFACTURING THE SAME

CROSS REFERENCE TO RELATED APPLICATIONS

This application claims the benefit of Korean Patent Application No. 10-2013-0145331 filed on Nov. 27, 2013, which is hereby incorporated by reference for all purposes as if fully set forth herein.

BACKGROUND OF THE INVENTION

1. Field of the Invention

The present disclosure relates to an organic light emitting display apparatus and method for manufacturing the same, and more particularly, to an organic light emitting display apparatus and method for manufacturing the same that is capable of reducing visually recognizable bubbles in the encapsulation structure.

2. Discussion of the Related Art

Currently, a liquid crystal display (LCD) apparatus is used most widely among various flat panel display apparatuses. Since the LCD apparatus is a non-emissive apparatus that does not generate light by itself, the LCD apparatus is relatively vulnerable in view of brightness, contrast ratio and viewing angle.

As a flat panel display apparatus that may solve such drawbacks of the LCD apparatus, an organic light emitting display (OLED) apparatus has received attention. Since the OLED apparatus is an emissive apparatus that generates light by itself, the OLED apparatus has brightness, contrast ratio and viewing angle that are better than those of the non-emissive apparatus. Also, since the OLED apparatus does not require a separate backlight, the OLED apparatus may be more lightweight and thinner than the LCD apparatus, and may consume less power than the LCD apparatus.

The OLED apparatus typically includes a thin film transistor, a first electrode electrically connected with the thin film transistor, a light-emissive organic layer on the first electrode, and a second electrode on the light-emissive organic layer.

Since the light-emissive organic layer is vulnerable to water and oxygen, an encapsulation structure is typically provided to prevent a light-emissive defect caused by permeation of water and oxygen into the light-emissive organic layer.

FIGS. 1 and 2 briefly illustrate cross-sectional views of OLED apparatuses having different encapsulation structures (hereinafter, referred to as "first and second type encapsulation structures").

As illustrated in FIGS. 1 and 2, these OLED apparatuses are substantially identical to each other in that they include a TFT substrate 10, which includes a thin film transistor (not shown), and an organic light emitting element 20 on the TFT substrate 10. The organic light emitting element 20 includes a first electrode 21 on the TFT substrate 10, which is electrically connected with the thin film transistor, a bank layer 22 formed on the TFT substrate 10 on which the first electrode 21 is formed and having a bank hole for exposing at least a part of the first electrode 21 corresponding to a light emitting area, a light-emissive organic layer 23 on the part of the first electrode 21, which is exposed through the bank hole of the bank layer 22, and a second electrode 24 on the light-emissive organic layer 23.

However, as illustrated in FIG. 1, the first type encapsulation structure includes an encapsulation glass 31 spaced apart from the organic light emitting element 20 at a predetermined distance, and a frit layer 32 disposed between the TFT substrate 10 and the encapsulation glass 31 at corners of the OLED apparatus.

In the first type encapsulation structure, the encapsulation glass 31 mainly prevents oxygen/water from being permeated into the light-emissive organic layer 23 through a face of the OLED apparatus, and the frit layer 32 mainly prevents oxygen/water from being permeated into the light-emissive organic layer 23 through a side of the organic light emitting display apparatus.

However, the OLED apparatus having the first type encapsulation structure has a problem in that the OLED apparatus is vulnerable to external impact, and thus may not be suitable for a flexible display apparatus.

In order to address such a problem of the first type encapsulation structure, the second type encapsulation structure has been suggested.

According to the second type encapsulation structure, as illustrated in FIG. 2, a passivation layer 40 is formed on the TFT substrate 10, in which the organic light emitting element 20 is formed, to fully cover the organic light emitting device 20. Subsequently, an encapsulation film 60 is bonded onto the TFT substrate 10, on which the passivation layer 40 is formed, using an adhesive layer 50.

In the second type encapsulation structure, the encapsulation film 60, the adhesive layer 50 and the passivation layer 40 mainly prevent oxygen/water from being permeated into the light-emissive organic layer 23 through the face of the organic light emitting display apparatus, and the adhesive layer 50 and the passivation layer 40 mainly prevent oxygen/water from being permeated into the light-emissive organic layer 23 through the side of the organic light emitting display apparatus.

However, the conventional adhesive layer 50 applied to the second type encapsulation structure has relatively low heat-resistance. Due to such low heat-resistance and difference in coefficient of thermal expansion with an adjacent structure, the adhesive layer 50 may be thermally deformed under an environment of high temperature and high humidity, as illustrated in FIG. 3. This may lead to a problem in that fine bubbles 51 inside the adhesive layer 50 are combined with one another to generate bubble(s) 52 that may be recognized visually.

These bubbles may be regarded as a product defect, and thus the productivity of the OLED apparatus may be lowered. The occurrence of these bubbles after the product has been sold may lower reliability and damage the brand image.

SUMMARY OF THE INVENTION

Accordingly, the present invention is directed to an organic light emitting display apparatus and method for manufacturing the same, which substantially obviates one or more problems due to limitations and disadvantages of the related art.

An advantage of the present invention is to provide an organic light emitting display apparatus and method for manufacturing the same that is capable of reducing visually recognizable bubbles that otherwise might be generated under an environment of high temperature and high humidity within the encapsulation structure.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, an organic light emitting display (OLED) apparatus may, for example, include a substrate; an organic light emitting element on the substrate, the organic light emitting element including a first electrode, an organic light emitting layer and a second electrode; a viscoelastic layer on the organic light emitting element, wherein an elastic portion of the viscoelastic layer is about 30% or more, the elastic portion being defined by <Equation 1>: Elastic portion ($E_p$) (%)=($\sigma/\sigma_0$)×100, wherein $\sigma_0$ is an initial stress generated when a strain of about 50% is applied to the viscoelastic layer and $\sigma$ is a final stress measured after the strain is continuously applied thereto for about 180 seconds, with the initial stress $\sigma_0$ and the final stress $\sigma$ being measured at about 80° C. through a relaxation modulus test.

In another aspect of the present invention, a method of manufacturing an organic light emitting display (OLED) apparatus may, for example, include forming an organic light emitting element on a first substrate, which includes forming a first electrode, forming an organic light emitting layer and forming a second electrode; forming a viscoelastic layer on the organic light emitting element, wherein an elastic portion of the viscoelastic layer is about 30% or more, with the elastic portion being defined by <Equation 1>: Elastic portion ($E_p$) (%)=($\sigma/\sigma_0$)×100, wherein $\sigma_0$ is an initial stress generated when a strain of about 50% is applied to the viscoelastic layer and $\sigma$ is a final stress measured after the strain is continuously applied thereto for about 180 seconds, with the initial stress $\sigma_0$ and the final stress $\sigma$ being measured at about 80° C. through a relaxation modulus test.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principles of the invention. In the drawings.

DETAILED DESCRIPTION OF THE INVENTION

Reference will now be made in detail to embodiments of the present invention, examples of which are illustrated in the accompanying drawings. Wherever possible, the same reference numbers may be used throughout the drawings to refer to the same or like parts.

When a structure is formed "on" another structure, it is to be understood that these structures are in contact with each other or that a third structure(s) is interposed between the structures. However, if the terminology "directly on" is used, it is to be understood that these structures are in contact with each other.

Figure 1:
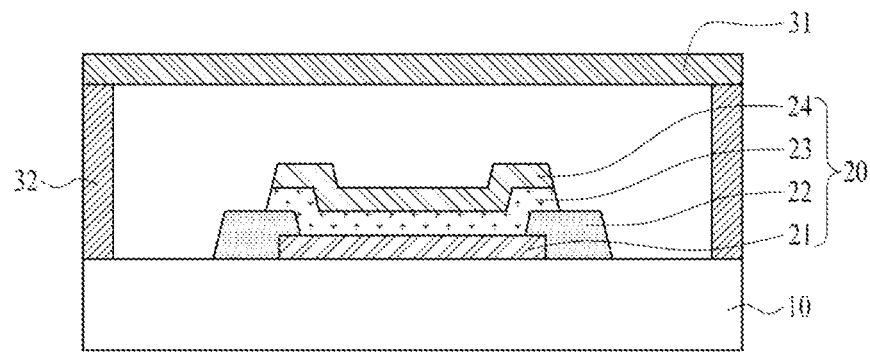
FIG. 1 briefly illustrates a cross-section of an organic light emitting display apparatus having a first encapsulation structure.
Figure 2:
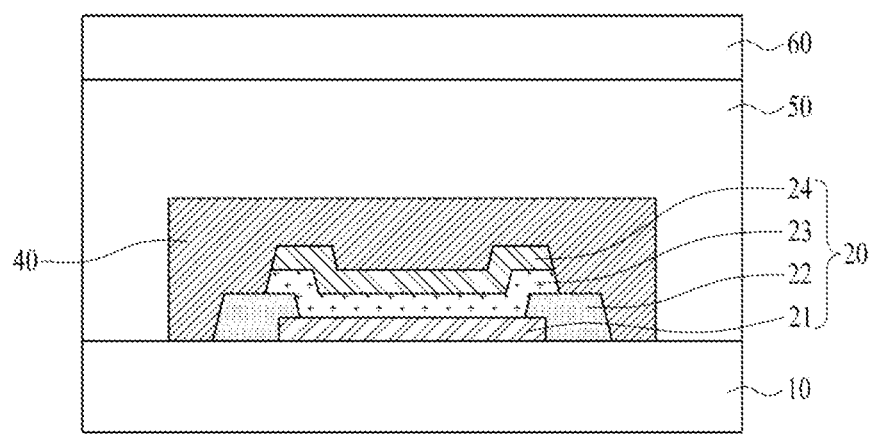
FIG. 2 briefly illustrates a cross-section of an organic light emitting display apparatus having a second encapsulation structure.
Figure 3:
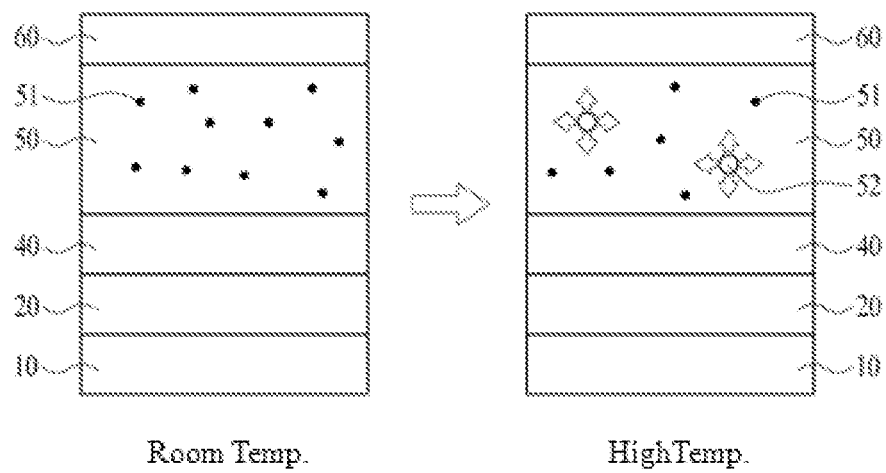
FIG. 3 is a cross-sectional view briefly illustrating generation of bubbles in an encapsulation structure of an organic light emitting display apparatus under an environment of high temperature and high humidity.
Figure 4:
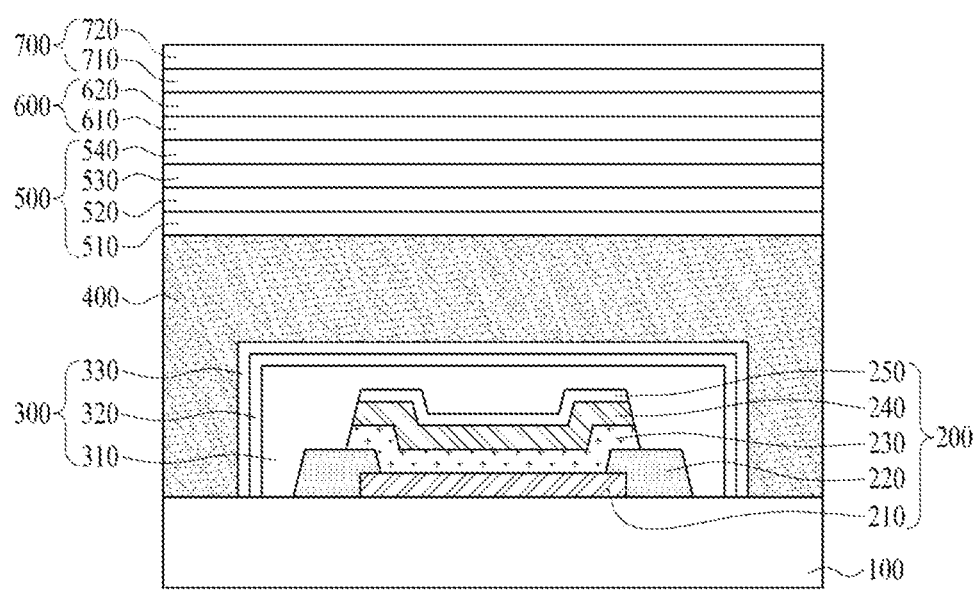
FIG. 4 is a cross-sectional view briefly illustrating an organic light emitting display apparatus according to an embodiment of the present invention.

FIG. 4 briefly illustrates a cross-section of an organic light emitting display (OLED) apparatus according to an embodiment of the present invention.

The OLED apparatus includes a TFT substrate 100, which includes a thin film transistor, an organic light emitting element 200, a passivation layer 300 formed on the organic light emitting element 200 to cover the organic light emitting element 200, a viscoelastic layer 400 formed on the passivation layer 300 to cover the passivation layer 300, and an encapsulation film 500 on the viscoelastic layer 400.

As illustrated in FIG. 4, the OLED apparatus may further include a circular polarizing plate 600 on the encapsulation film 500, and a front module 700 on the circular polarizing plate 600.

Figure 5:
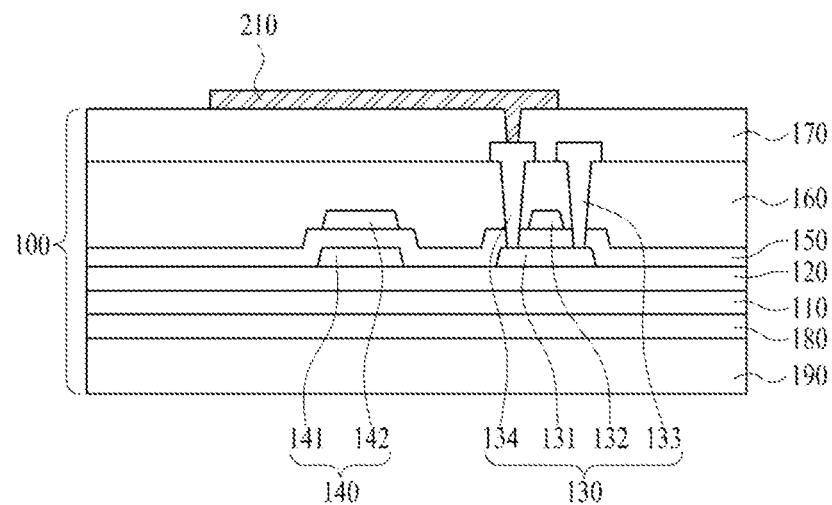
FIG. 5 is a cross-sectional view briefly illustrating a TFT substrate according to an embodiment of the present invention.

FIG. 5 briefly illustrates a cross-section of a TFT substrate 100 according to an embodiment of the present invention.

As illustrated in FIG. 5, the TFT substrate 100 includes a polyimide film 110, a buffer layer 120 on one surface of the polyimide film 110, a thin film transistor 130 and a capacitor 140 formed on the buffer layer 120, and a rear plate 190 attached onto another surface of the polyimide film 110 using an adhesive layer 180.

The thin film transistor 130 includes a semiconductor layer 131, a gate electrode 132, and source and drain electrodes 133 and 134. The capacitor 140 includes a capacitor lower electrode 141 and a capacitor upper electrode 142.

A gate insulating film 150 is formed between the semiconductor layer 131 and the gate electrode 132 and between the capacitor lower electrode 141 and the capacitor upper electrode 142. An interlayer insulating film 160 is formed on the capacitor upper electrode 142 and between the gate electrode 132 and the source and drain electrodes 133 and 134.

An overcoat layer 170 is formed on the interlayer insulating film 160 and the source and drain electrodes 133 and 134 in order to passivate the thin film transistor 130 and the capacitor 140 and planarize a step difference caused by the thin film transistor 130.

A first electrode 210 of the organic light emitting element 200 is electrically connected with the drain electrode 134 of the thin film transistor 130 through a hole formed in the overcoat layer 170.

Although the TFT substrate 100 illustrated in FIG. 5 has a structure for a flexible display apparatus and includes a top-gate type thin film transistor where the gate electrode 132 is disposed above the semiconductor layer 131, the present invention is not limited to such a structure of FIG. 5, and the TFT substrate 100 may include a bottom-gate type thin film transistor where the gate electrode is located below the semiconductor layer or have a non-flexible structure.

Figure 6:
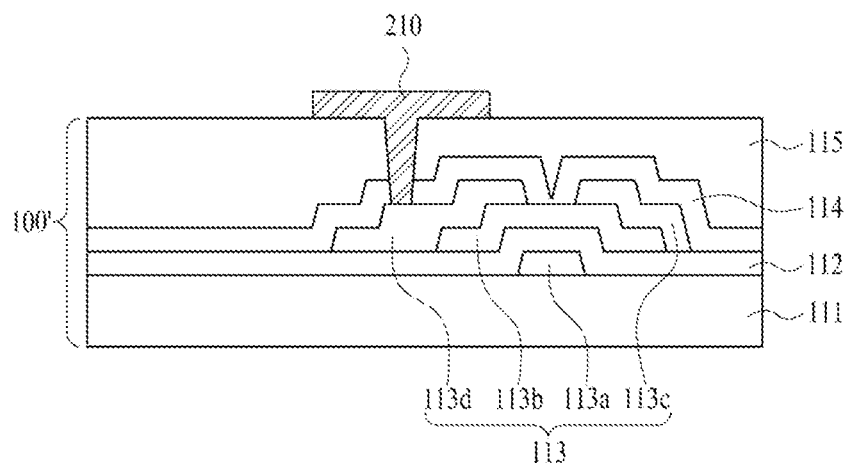
FIG. 6 is a cross-sectional view briefly illustrating a TFT substrate according to another embodiment of the present invention.

For example, as illustrated in FIG. 6, the TFT substrate 100' includes a substrate 111 formed of glass or plastic material, a gate electrode 113a on the substrate 111, a gate insulating film 112 and the gate electrode 113a, a semiconductor layer 113b overlapped with the gate electrode 113a, with the gate insulating film 112 interposed between the semiconductor 113b and the gate electrode 113a, source and drain electrodes 113c and 113d spaced apart from each other on the gate insulating film 112 and the semiconductor layer 113b, and an inorganic insulating film 114 and an organic insulating film 115 sequentially formed on the substrate 111 provided with the thin film transistor 113. The first electrode 210 of the organic light emitting element 200 is electrically connected with the drain electrode 113d of the thin film transistor 113 through a hole formed in the inorganic insulating film 114 and the organic insulating film 115.

Hereinafter, the organic light emitting element 200 on the TFT substrate 100 according to an embodiment of the present invention will be described in more detail with reference to FIG. 4.

The organic light emitting element 200 includes a first electrode 210 on the TFT substrate 100, a bank layer 220 formed on the first electrode 210 and having a bank hole to expose at least a part of the first electrode 210 corresponding to a light emitting area, a light-emissive organic layer 230 on the part of the first electrode 210, which is exposed through the bank hole of the bank layer 220, a second electrode 240 on the light-emissive organic layer 230, and a capping layer 250 on the second electrode 240.

The first electrode 210 is electrically connected with the thin film transistor of the TFT substrate 100 (more specifically, electrically connected with the drain electrode 134). The first electrode 210 may be an anode electrode and formed of a transparent conductive material having a high work function, such as indium tin oxide (ITO), indium zinc oxide (IZO), indium tin zinc oxide (ITZO), indium cerium oxide (ICO), or ZnO.

The bank hole of the bank layer 220 may define the light emitting area by exposing at least a part of the first electrode 210.

The light-emissive organic layer 230 formed on the first electrode 210 and a part of the bank layer 220 may include a light emitting layer, a hole injection layer and/or a hole transport layer between the first electrode 210 and the light emitting layer, and an electron injection layer and/or an electron transport layer between the second electrode 240 and the light emitting layer.

The second electrode 240 disposed on the light-emissive organic layer 230 may be a cathode electrode and formed of metal having a low work function such as Al, Mg, Ca, Ag or their alloy.

The OLED apparatus according to an embodiment of the present invention may be a rear light-emissive type where light emitted from the light-emissive organic layer 230 passes through the TFT substrate 100 or a front light-emissive type where light emitted from the light-emissive organic layer 230 passes through the front module 700.

In case of the rear light-emissive type OLED apparatus, the second electrode 240 may have a thickness enough to reflect light.

On the other hand, in case of the front light-emissive type OLED apparatus, the second electrode 240 may have a thickness thin enough (e.g., 1 Å to 50 Å) to transmit light, and a reflecting layer (not shown) formed of Al, Ag or Ni may be arranged below the first electrode 210. Also, as illustrated in FIG. 4, the capping layer 250 may be formed on the second electrode 240. The capping layer 250 is used to reduce or prevent the light emitted from the light-emissive organic layer 230 from being totally reflected above the second electrode 240, and may be formed of a mixture of a conductive inorganic material and an organic material. A metal, for example, transition metal, alkali metal, alkali earth metal, rare-earth metal, or their alloy of two or more metals may be used as the conductive inorganic material. An organic material (for example, material that may be used as a host material of the hole transport layer) having excellent hole mobility or an organic material (for example, material that may be used as a host material of the electron transport layer) having excellent electron mobility may be used as the organic material. The conductive inorganic material may increase scattering of light and absorption of light by generating surface Plasmon resonance at the capping layer 250, and may prevent total reflection from occurring above the second electrode 240, whereby light extraction effect of the OLED apparatus is improved.

Meanwhile, as illustrated in FIG. 4, the OLED apparatus according to an embodiment of the present invention includes a passivation layer 300 formed on the TFT substrate 100 to cover the organic light emitting element 200.

The passivation layer 300 includes a first inorganic layer 310 formed on the TFT substrate 100 and the organic light emitting element 200, an organic layer 320 on the first inorganic layer 310, and a second inorganic layer 330 on the organic layer 320.

The first and second inorganic layers 310 and 330 may be formed of a material that includes one or more of $Al_2O_3$, $SiO_2$, $Si_3N_4$, SiON, AlON, AlN, $TiO_2$, ZrO, ZnO, and $Ta_2O_5$, and the organic layer 320 may be formed of an organic matter suitable for shielding water/oxygen, such as acryl resin, epoxy resin, polyimide resin, and polyethylene. The organic layer 320 serves to reduce stress between the respective layers, which occurs when the OLED apparatus is bent.

The OLED apparatus further includes a viscoelastic layer 400 formed on the TFT substrate 100 to fully cover the passivation layer 300, and an encapsulation film 500 on the viscoelastic layer 400.

Hereinafter, the viscoelastic layer 400 according to an embodiment of the present invention will be described in more detail with reference to FIGS. 7 and 8.

Figure 7:
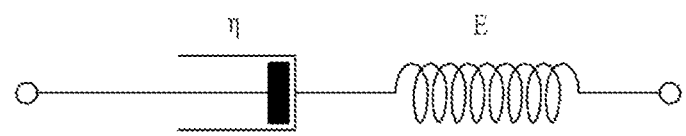
FIG. 7 is a Maxwell model of a viscoelastic material.
Figure 8:
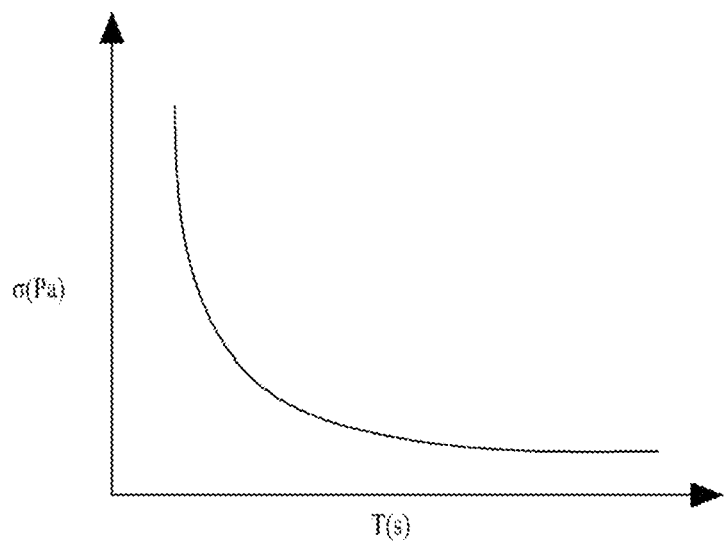
FIG. 8 is a graph illustrating variation of stress with time of a viscoelastic material measured through a relaxation modulus test.

FIG. 7 is a Maxwell model of a viscoelastic material, and FIG. 8 is a graph illustrating variation of stress with time of a viscoelastic material measured through a relaxation modulus test.

The viscoelastic layer 400 is formed of a viscoelastic material that may be displayed as a Maxwell model illustrated in FIG. 5. As illustrated in FIG. 5, the viscoelastic material generally includes a dashpot element η and a spring element E.

As illustrated in the graph of FIG. 8, if a rapid strain is given to the viscoelastic material at a predetermined temperature through the relaxation modulus test, the spring element E is immediately stretched and at the same time stress σ is generated. However, as time T passes, a strain of the spring element E is offset by the dashpot element η, and stress σ is rapidly reduced and then is converged to a specific value.

The relaxation modulus test is a linear viscoelastic measurement method, which is performed to obtain information on a structure of a material having viscoelasticity. The relaxation modulus test measures variation of stress with the lapse of time when a constant strain is given at a predetermined temperature condition. Namely, stress caused by a stimulus such as a strain, which is given to the material, is measured by a reaction of the material to the stimulus.

Preferably, the viscoelastic layer 400 is formed of a viscoelastic material that basically satisfies characteristics, such as water vapor transmissibility of about 10 g/m$^2$/day or less, visible light transmissibility of about 95% or more and a modulus of about 0.3 MPa or less, at the same time. The viscoelastic layer 400 is used to encapsulate the OLED apparatus.

In addition, the viscoelastic layer 400 is formed of a viscoelastic material, and its elastic portion ($E_p$), which is defined by the following Equation 1, is about 30% or more:

$$\text{Elastic portion}(E_p)(\%)=(\sigma/\sigma_0)\times 100, \qquad \text{<Equation 1>:}$$

wherein $\sigma_0$ is initial stress generated when a strain of about 50% is applied to the viscoelastic material and $\sigma$ is final stress measured after the strain is continuously applied thereto for about 180 seconds, with the initial stress $\sigma_0$ and the final stress $\sigma$ being measured at about 80° C. through a relaxation modulus test.

In other words, the elastic portion $E_p$ may be used as a reference for determining whether a certain viscoelastic material is suitable for the encapsulation structure of the OLED apparatus. When the viscoelastic layer 400 has an elastic portion $E_p$ of about 30% or more, bubbles that might be recognized under an environment of high temperature and high humidity may remarkably be reduced or prevented from occurring.

The viscoelastic layer 400 may be formed of a viscoelastic material that includes acryl resin, olefin resin, synthetic rubber, or mixture of two or more thereof.

The encapsulation film 500 formed on the viscoelastic layer 400 may include an optically-isotropic film 540, a first organic film 530 on the optically-isotropic film 540, an inorganic film 520 on the first organic film 530, and a second organic film 510 on the inorganic film 520. The second organic film 510 may be directly in contact with the viscoelastic layer 400.

The inorganic film 520 may be formed of a material that includes one or more of $Al_2O_3$, $SiO_2$, $Si_3N_4$, SiON, AlON, AlN, $TiO_2$, ZrO, ZnO, and $Ta_2O_5$, and the first and second organic films 510 and 530 may be formed of an organic matter suitable for shielding water/oxygen, such as acryl resin, epoxy resin, polyimide resin, and polyethylene. The first and second organic films 510 and 530 serve to reduce stress which occurs when the OLED apparatus is bent.

According to one embodiment of the present invention, the viscoelastic layer 400 and the encapsulation film 500 have a water vapor transmission rate of about $5\times10^{-2}$ g/m$^2$/day or less. In order to have the water vapor transmission rate, the encapsulation film 500 may further include additional inorganic film and/or additional organic film.

As illustrated in FIG. 4, the OLED apparatus according to one embodiment of the present invention further includes a circular polarizing plate 600 on the encapsulation film 500, and a front module 700 on the circular polarizing plate 600.

For adhesion with the circular polarizing plate 600, the encapsulation film 500 may further include an adhesive film on the optically-isotropic film 540.

Also, for adhesion between the circular polarizing plate 600 and the front module 700, the OLED apparatus may further include an adhesive layer (not shown) formed of an adhesive material such as a pressure sensitive adhesive (PSA) and an optically clear adhesive (OCA).

The circular polarizing plate 600 is used to reduce or prevent visibility deterioration from occurring, which is caused as the external light reflected by the organic light emitting element 200 is emitted from the OLED apparatus, and may reduce or prevent the external light reflected by the second electrode 240 of the organic light emitting element 200 from being emitted from the OLED apparatus.

The circular polarizing plate 600 may include a λ/4 phase difference film 610 on the encapsulation film 500 and a linear polarizing film 620 on the λ/4 phase difference film 610. The external light becomes the linear polarizing light after passing through the linear polarizing film 620. The linear polarizing light passes through the λ/4 phase difference film 610, is reflected by the second electrode 240 and converted to a liner polarizing light vertical to a transmission axis of the linear polarizing film 620 after passing through again the λ/4 phase difference film 610, and then is absorbed by the linear polarizing film 620.

The λ14 phase difference film 610 may have a thickness of about 50 μm to about 100 μm and a phase retardation value of about 120 nm to about 148 nm.

In order to effectively reduce or prevent the external light reflected by the second electrode 240 of the organic light emitting element 200 from being visible by being emitted from the OLED apparatus, the optically-isotropic film 540 of the encapsulation film 500 may be an isotropic film having a phase retardation value of about 10 nm or less.

The front module 700 may include a touch film 710 and a cover window 720, and may be attached to the circular polarizing plate 500 using an adhesive layer. The cover window may be formed of glass or plastic.

Hereinafter, a method for manufacturing an OLED apparatus according to an embodiment of the present invention will be described in detail with reference to FIGS. 9 to 15.

Figure 9:
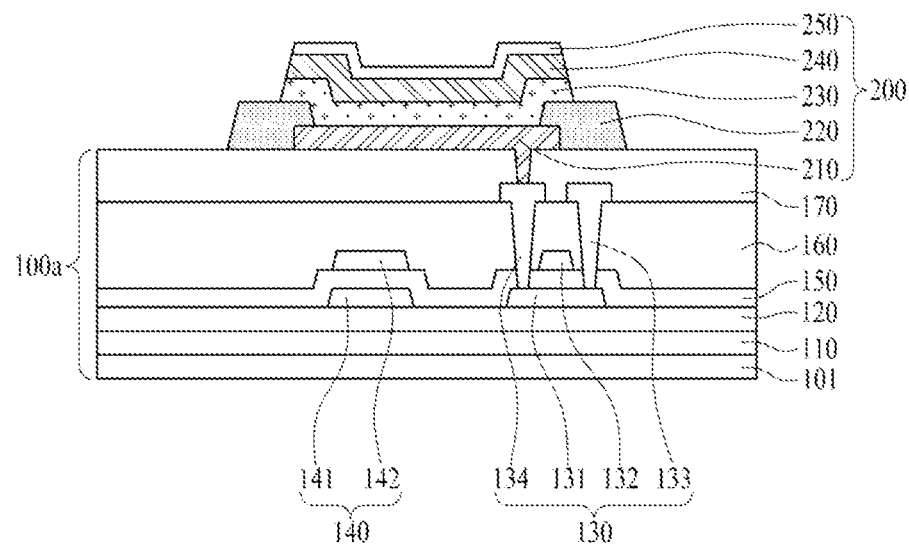
FIGS. 9 to 15 are cross-sectional views illustrating a method for manufacturing an organic light emitting display apparatus according to an embodiment of the present invention.

First of all, as illustrated in FIG. 9, after a substrate 100a that includes a thin film transistor 130 is prepared, an organic light emitting element 200 is formed on the substrate 100a.

In order to prepare the substrate 100a, a polyimide film 110 is formed on a glass substrate 101. Subsequently, a buffer layer 120 of an inorganic material is formed on the polyimide film 110.

The semiconductor layer 131 and the capacitor lower electrode 141 are formed to be spaced apart from each other on the buffer layer 120. The semiconductor layer 131 may be amorphous silicon, polysilicon, or oxide semiconductor.

A gate insulating film 150 is formed on the buffer layer 120 provided with the semiconductor layer 131 and the capacitor lower electrode 141. The gate insulating film 150 may be formed of a silicon oxide film (SiOx) or a silicon nitride film (SiNx).

The gate electrode 132 and the capacitor upper electrode 142 are respectively formed on the gate insulating film 150 to be respectively overlapped with the semiconductor layer 131 and the capacitor lower electrode 141. The gate electrode 132 and the capacitor upper electrode 142 may be formed of Al, Mo, Cr, Au, Ti, Ni, Cu, or their alloy of two or more.

Subsequently, an interlayer insulating film 160 is formed on the gate insulating film 150 provided with the gate electrode 132 and the capacitor upper electrode 142. The interlayer insulating film 160 may be an inorganic single film or an inorganic/organic double film.

The interlayer insulating film 160 and the gate insulating film 150 may selectively be etched at both sides of the gate electrode 132 interposed between the interlayer insulating film 160 and the gate insulating film 150, whereby two via holes partially exposing the semiconductor layer 131 are formed. Subsequently, after a metal layer is formed of Al, Mo, Cr, Au, Ti, Ni, Cu or their alloy of two or more on the interlayer insulating film 160, source and drain electrodes 133 and 134 are formed by photolithography and etching processes.

An overcoat layer 170 for passivating the thin film transistor 130 and the capacitor 140 and planarizing the step difference caused by the thin film transistor 130 is formed on the interlayer insulating film 160 provided with the source and drain electrodes 133 and 134. The overcoat layer 170 may be an inorganic single layer or an inorganic/organic double layer.

In order to form the organic light emitting element 200 on the substrate 100a completed as above, the overcoat layer 170 is selectively etched, whereby a hole for partially exposing the drain electrode 134 is formed. Subsequently, after a transparent conductive material having a high work function, such as ITO, IZO, ITZO, ICO, or ZnO, is deposited on the substrate 100a through a CVD or sputtering process, the first electrode 210 is formed by photolithography and etching processes.

In the case that the front light-emissive type OLED apparatus is manufactured, a reflective layer (not shown) may be formed on the substrate 100a before forming the first electrode 210 with metal such as Ag or Ni.

After an organic insulating layer is formed on the substrate 100a provided with the first electrode 210 by using an organic non-conductive material such as benzocyclobutene (BCB), acryl resin, epoxy resin, polyamide resin, and polyimide resin, a selective etching process is performed to etch the organic insulating layer to form a bank layer 220 having a bank hole, which exposes at least a part of the first electrode 210.

Subsequently, a light-emissive organic layer 230, a second electrode 240, and a capping layer 220 are sequentially formed on the bank layer 220 and the first electrode 210 by the known methods.

The second electrode 240 disposed on the light-emissive organic layer 230 may be formed of Al, Mg, Ca, Ag or their alloy, which has a low work function. In the case that the rear light-emissive type OLED apparatus is manufactured, the second electrode 240 is formed to have a thickness thick enough to reflect light. On the other hand, in the case that the front light-emissive type OLED apparatus is manufactured, the second electrode 240 is formed to have a thickness thin enough (e.g., 1 Å to 50 Å) to transmit light.

The capping layer 250, which is used to reduce or prevent the light emitted from the light-emissive organic layer 230 from being totally reflected above the second electrode 240, is formed on the second electrode 240. The capping layer 250 may have a thickness of about 10 nm to about 100 nm.

As described above, the capping layer 250 may be formed of a mixture of a conductive inorganic material and an organic material. A metal, for example, transition metal, alkali metal, alkali earth metal, rare-earth metal, or their alloy of two or more metals may be used as the conductive inorganic material. For example, if a nanosilver particle is used as the conductive inorganic material, the nanosilver particle and the organic material are respectively jetted and then deposited on the second electrode 240 to form the capping layer 250, wherein the content of the nanosilver particle contained in the capping layer 250 may be less than about 10% by weight.

Figure 10:
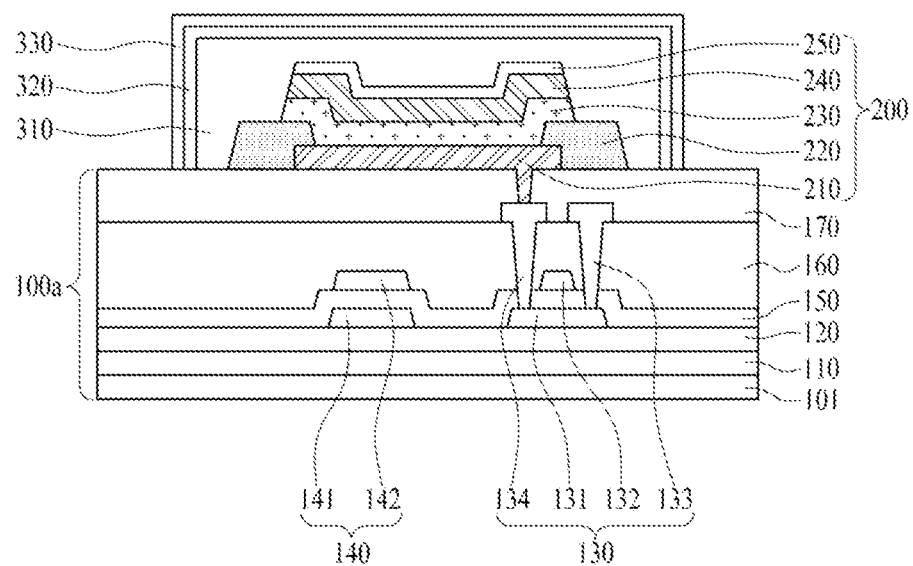

Subsequently, as illustrated in FIG. 10, the passivation layer 300 is formed on the substrate 100a to fully cover the organic light emitting element 200.

The step of forming the passivation layer 300 includes the steps of forming the first inorganic layer 310 on the TFT substrate 100 and the organic light emitting element 200, forming the organic layer 320 on the first inorganic layer 310, and forming the second inorganic layer 330 on the organic layer 320.

Each of the first and second inorganic layers 310 and 330 may be formed of a material that includes one or more of $Al_2O_3$, $SiO_2$, $Si_3N_4$, SiON, AlON, AlN, $TiO_2$, ZrO, ZnO, and $Ta_2O_5$, and the organic layer 320 may be formed of an organic matter suitable for shielding water/oxygen, such as acryl resin, epoxy resin, polyimide resin, and polyethylene.

Since the light-emissive organic layer 230 may be damaged at a high temperature of 110 or more, it is preferable that the first and second inorganic layers 310 and 330 are formed through a low temperature PECVD or ALD process of 80 to 100.

The organic layer 320 may be formed through vapor deposition, coating or printing.

Figure 11:
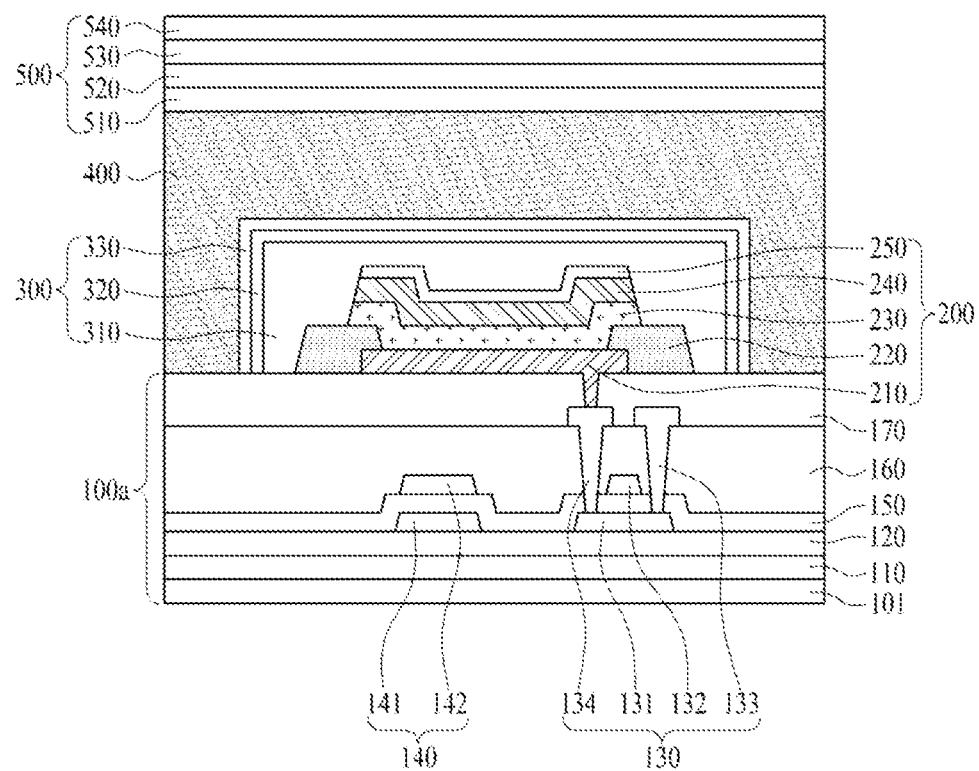

Subsequently, as illustrated in FIG. 11, the encapsulation film 500 is attached onto the passivation layer 300 through the viscoelastic layer 400. The viscoelastic layer 400 may be a double sided tape.

The viscoelastic layer 400 according to an embodiment of the present invention, which is interposed between the passivation layer 300 and the encapsulation film 500, is formed of a viscoelastic material, and its elastic portion, which is defined by Equation 1, is about 30% or more.

$$\text{Elastic portion}(\%) = (\sigma/\sigma_0) \times 100, \qquad \text{<Equation 1>:}$$

$\sigma_0$ is initial stress generated when a strain of about 50% is applied to the viscoelastic material and $\sigma$ is final stress measured after the strain is continuously applied thereto for about 180 seconds. The initial stress $\sigma_0$ and the final stress $\sigma$ are measured at about 80° C. through a relaxation modulus test.

As described above, the viscoelastic material may include acrylic resin, olefin resin, synthetic rubber or mixture of two or more thereof, which satisfies various characteristics of the encapsulation structure of the OLED apparatus, that is, water vapor transmissibility of about 10 $g/m^2/day$ or less, visible light transmissibility of about 95% or more, and modulus of about 0.3 MPa or less.

According to one embodiment of the present invention, the first organic film 530, the inorganic film 520, and the second organic film 510 are sequentially deposited on the optically-isotropic film 540, whereby the encapsulation film 500 which is separately formed may be attached to the passivation layer 300 and the TFT substrate 100 through the viscoelastic layer 400. At this time, the second organic film 510 is directly in contact with the viscoelastic layer 400.

The first and second organic films 510 and 530 may be formed by vapor deposition, coating or printing of an organic matter suitable for shielding water/oxygen, such as acryl resin, epoxy resin, polyimide resin, and polyethylene.

The inorganic film 520 may be formed through a CVD or ALD process, and include an inorganic matter such as $Al_2O_3$, $SiO_2$, $Si_3N_4$, SiON, AlON, AlN, $TiO_2$, ZrO, ZnO, and $Ta_2O_5$, for example.

Figure 12:
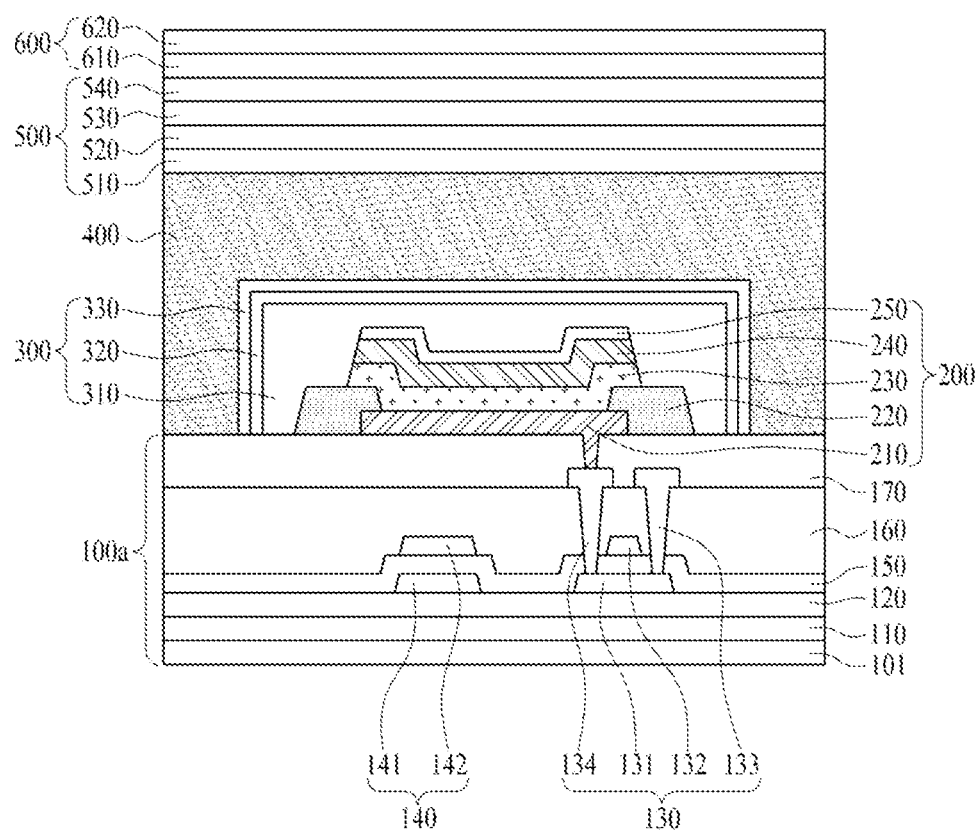

After adhesion of the encapsulation film 500, as illustrated in FIG. 12, the circular polarizing plate 600, which is separately formed, is attached onto the encapsulation film 500. For adhesion with the circular polarizing plate 600, the encapsulation film 500 may further include an adhesive film on the optically-isotropic film 540.

The circular polarizing plate 600 may include a λ/4 phase difference film 610 attached onto the encapsulation film 500 and a linear polarizing film 620 on the λ/4 phase difference film 610.

Figure 13:
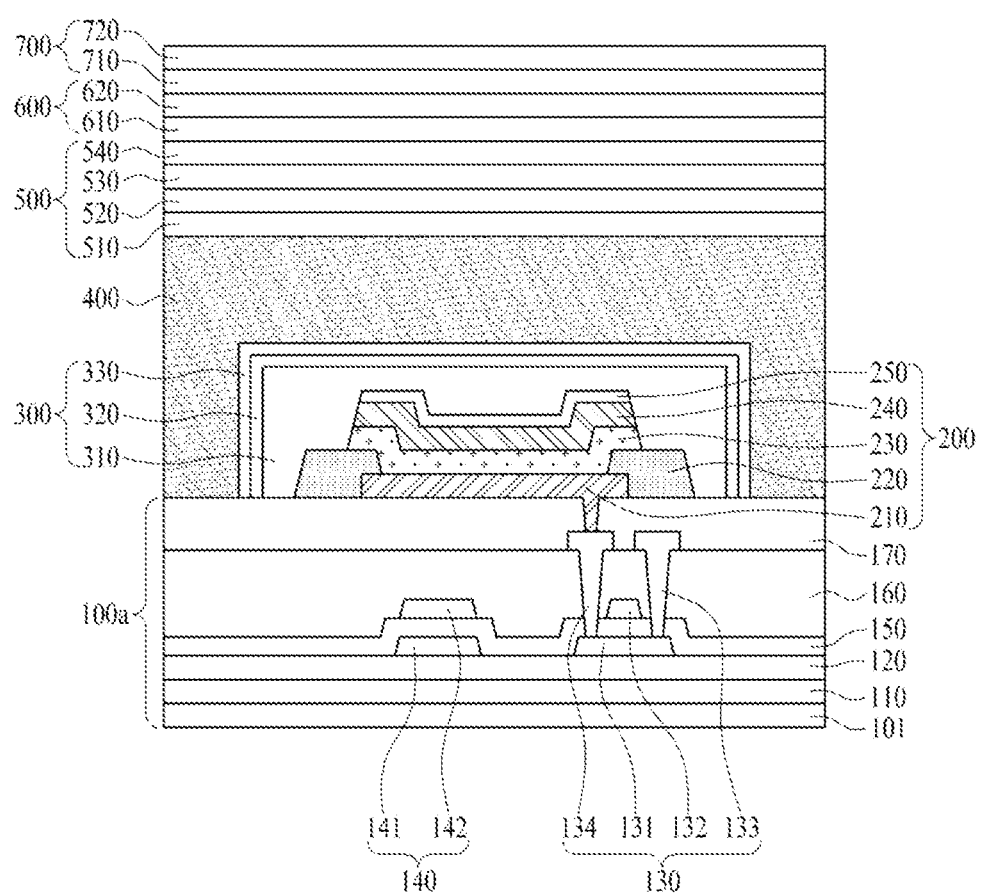

Subsequently, as illustrated in FIG. 13, the front module 700 that includes a touch film 710 and a cover window 720 is attached onto the circular polarizing plate 600. For adhesion between the circular polarizing plate 600 and the front module 700, an adhesive such as a pressure sensitive adhesive (PSA) and an optically clear adhesive (OCA) may be used.

Figure 14:
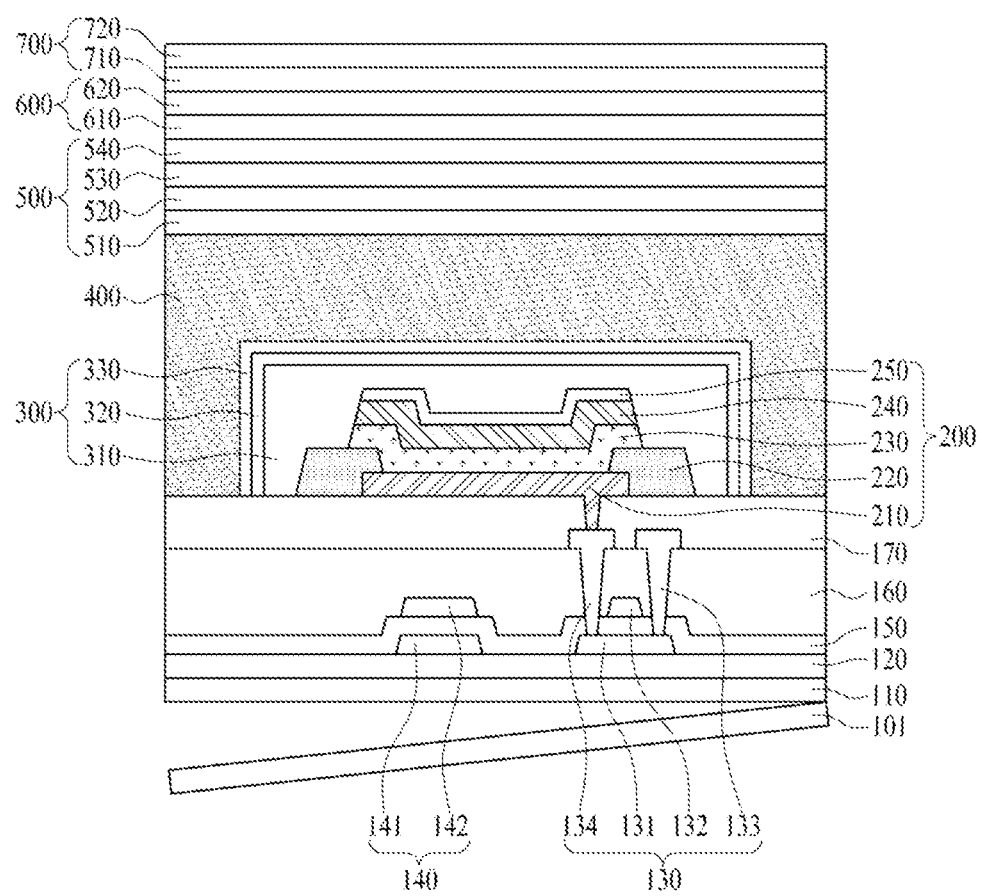

Subsequently, as illustrated in FIG. 14, the glass substrate 101 which has performed a support function during the manufacturing process may be separated from the polyimide film 110 using a laser. For ease of separation, a sacrificing layer (not shown), which can be heated and decomposed by absorbing an irradiated laser, may further be formed between the glass substrate 101 and the polyimide film 110.

Figure 15:
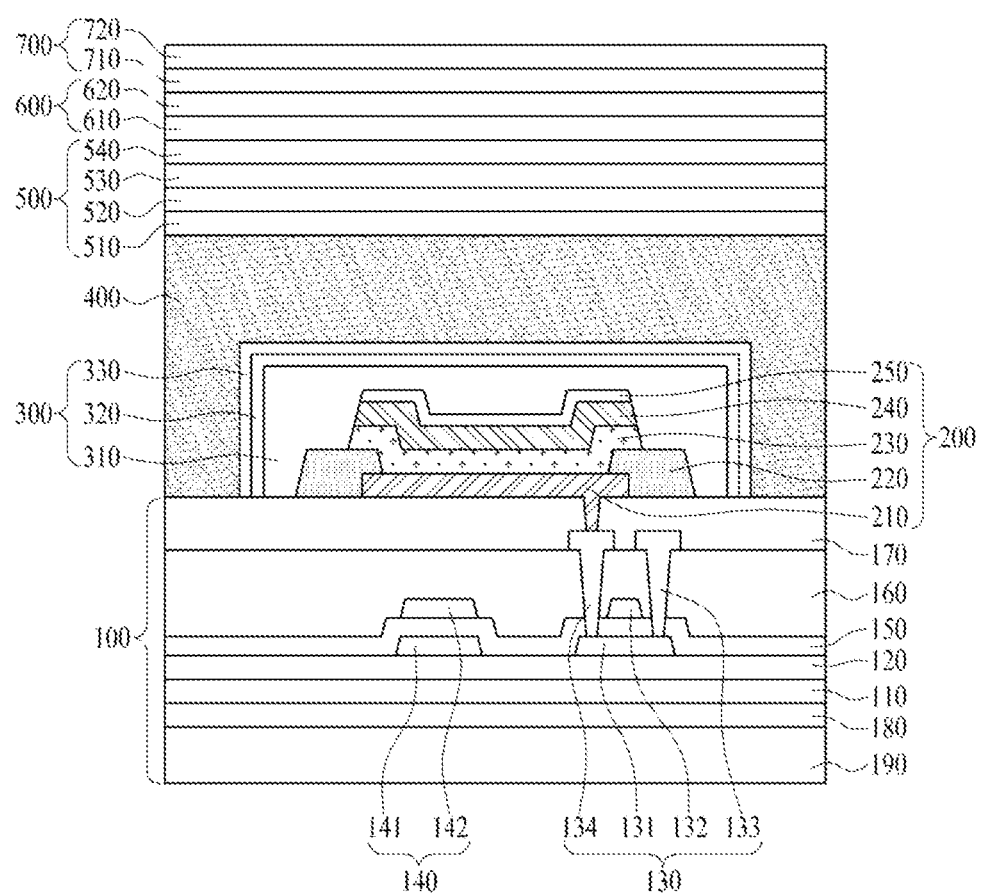

Subsequently, as illustrated in FIG. 15, after the glass substrate 101 is separated from the polyimide film 110, a rear plate 190 may be attached to the polyimide film 110 using an adhesive layer 180 such as a pressure sensitive adhesive (PSA) and an optically clear adhesive (OCA) as a support for the OLED apparatus according to an embodiment of the present invention.

Hereinafter, experiment results according to embodiments of the present invention will be described, along with a comparison example, in more detail.

EXPERIMENTS

Measurement of Elastic Portion ($E_p$) (%) of Viscoelastic Material

A relaxation modulus test was carried out by means of the rheometer of ARES (currently, TA Instrument) for viscoelastic materials of a double-sided tape type used to manufacture an encapsulation structure of an OLED apparatus, under the following conditions.

Mode: stress relaxation mode
Strain: 50%
Temperature: 80° C.
Duration: 180 seconds
Axial force/strain: set to 'disabled'

Through the relaxation modulus tests, the initial stress $\sigma_0$ generated when a strain of 50% is applied to the viscoelastic material and the final stress $\sigma$ after the strain is maintained for 180 seconds were respectively measured, and then the elastic portions ($E_p$) (%) of the viscoelastic materials were obtained in accordance with the following Equation 1:

$$\text{Elastic portion}(E_p)(\%) = (\sigma/\sigma_0) \times 100. \qquad \text{<Equation 1>}$$

Examples 1 to 3

Organic light emitting display apparatuses having the structure of FIG. 4 were manufactured using viscoelastic materials having elastic portions ($E_p$) of 30%, 35% and 40% respectively.

Comparative Example

An organic light emitting display apparatus having the structure of FIG. 4 was manufactured using a viscoelastic material having an elastic portion ($E_p$) of 20%.

A reliability test was performed in accordance with the following method for the OLED apparatuses of the examples 1 to 3 and comparative example, and the results thereof are shown in the following Table 1.

Reliability Test 10 samples per each apparatus were provided at the high temperature of 80° C. for 180 hours, and then a visual inspection was performed to see whether visually recognizable bubbles had been generated.

TABLE 1

| | Elastic portion ($E_p$) of viscoelastic material (%) | The number of samples where bubble(s) was(were) observed | Remark |
| --- | --- | --- | --- |
| Ex. 1 | 30 | 0 | — |
| Ex. 2 | 35 | 0 | — |
| Ex. 3 | 40 | 0 | — |
| Comp. Ex. | 20 | 4 | A total of seven bubbles occurred at four samples |

As shown in Table 1, visually recognizable bubbles, which otherwise might be generated under an environment of high temperature and high humidity, are remarkably reduced or prevented when the encapsulation structure is manufactured using the viscoelastic material having an elastic portion ($E_p$) of 30% or more.

As described above, visually recognizable bubbles can be remarkably reduced or prevented within an encapsulation structure of an OLED apparatus even under an environment of high temperature and high humidity.

Accordingly, not only can the productivity of the OLED apparatus be improved, but also the deterioration of the product reliability and damage to the brand image due to the visually recognizable bubbles can be reduced or prevented.

Also, a reference for determining whether a certain viscoelastic material is suitable for an encapsulation structure of an OLED apparatus may be provided.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting display (OLED) apparatus, comprising:
   a substrate;
   an organic light emitting element on the substrate, the organic light emitting element including a first electrode, an organic light emitting layer and a second electrode;
   a viscoelastic layer on the organic light emitting element, wherein an elastic portion of the viscoelastic layer is about 30% or more, the elastic portion being defined by Equation 1:

$$\text{Elastic portion}(E_p)(\%) = (\sigma/\sigma_0) \times 100, \qquad \text{<Equation 1>}$$

wherein $\sigma_0$ is an initial stress generated when a strain of about 50% is applied to the viscoelastic layer and $\sigma$ is a final stress measured after the strain is continuously applied thereto for about 180 seconds, with the initial stress $\sigma_0$ and the final stress $\sigma$ being measured at about 80° C. through a relaxation modulus test.

2. The OLED apparatus according to claim 1, further comprising a passivation layer between the organic light emitting element and the viscoelastic layer, wherein the passivation layer has a combination of an organic layer and an inorganic layer.

3. The OLED apparatus according to claim 1, wherein the viscoelastic layer satisfies at least one of a water vapor transmissibility of about 10 g/m²/day or less, a visible light transmissibility of about 95% or more, and a modulus of about 0.3 MPa or less.

4. The OLED apparatus according to claim 1, wherein the viscoelastic layer includes at least one of acryl resin, olefin resin and synthetic rubber.

5. The OLED apparatus according to claim 1, further comprising an encapsulation film on the viscoelastic layer.

6. The OLED apparatus according to claim 5, wherein the encapsulation film has a combination of an organic layer and an inorganic layer.

7. The OLED apparatus according to claim 6, wherein the organic layer of the encapsulation film is in contact with the viscoelastic layer.

8. The OLED apparatus according to claim 6, wherein the organic layer of the encapsulation film includes at least one of acryl resin, epoxy resin, polyimide resin and polyethylene.

9. The OLED apparatus according to claim 6, wherein the inorganic layer of the encapsulation film includes at least one of $Al_2O_3$, $SiO_2$, $Si_3N_4$, SiON, AlON, AlN, $TiO_2$, ZrO, ZnO and $Ta_2O_5$.

10. The OLED apparatus according to claim 5, further comprising a circular polarizing plate on the encapsulation film, and a touch film on the polarizing plate.

* * * * *